United States Patent
Orii et al.

(10) Patent No.: US 12,538,728 B2
(45) Date of Patent: Jan. 27, 2026

(54) ETCHING METHOD AND ETCHING DEVICE

(71) Applicant: Tokyo Electron Limited, Tokyo (JP)

(72) Inventors: Takehiko Orii, Yamanashi (JP); Nobuhiro Takahashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 548 days.

(21) Appl. No.: 17/997,155

(22) PCT Filed: Apr. 15, 2021

(86) PCT No.: PCT/JP2021/015629
§ 371 (c)(1),
(2) Date: Oct. 26, 2022

(87) PCT Pub. No.: WO2021/220834
PCT Pub. Date: Nov. 4, 2021

(65) Prior Publication Data
US 2023/0223270 A1 Jul. 13, 2023

(30) Foreign Application Priority Data
Apr. 28, 2020 (JP) .................................. 2020-079680

(51) Int. Cl.
*H01L 21/311* (2006.01)
*H01L 21/02* (2006.01)
*H01L 21/67* (2006.01)

(52) U.S. Cl.
CPC .. *H01L 21/31144* (2013.01); *H01L 21/02203* (2013.01); *H01L 21/31116* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 2015/0270140 A1* | 9/2015 | Gupta | H01L 21/32136 216/67 |
| 2018/0166255 A1 | 6/2018 | Blomberg et al. | |
| 2019/0198349 A1* | 6/2019 | Asada | H01L 21/68742 |
| 2020/0312669 A1* | 10/2020 | Takahashi | H01L 21/3105 |

FOREIGN PATENT DOCUMENTS

| | | |
|---|---|---|
| CN | 102683196 A | 9/2012 |
| CN | 109979815 A | 7/2019 |
| JP | 2016-63141 A | 4/2016 |

* cited by examiner

*Primary Examiner* — Binh X Tran
(74) *Attorney, Agent, or Firm* — Nath, Goldberg & Meyer; Jerald L. Meyer; Tanya E. Harkins

(57) ABSTRACT

An etching method of supplying etching gases to a substrate to etch a surface of the substrate, includes a protection step of supplying amine gas to the substrate having an oxygen-containing silicon film to form a protective film for preventing etching by the etching gases on a surface of the oxygen-containing silicon film, for protecting the oxygen-containing silicon film, and a first etching step of supplying a first etching gas, which is one of the etching gases and is a fluorine-containing gas, and the amine gas to the substrate to etch the oxygen-containing silicon film.

11 Claims, 21 Drawing Sheets

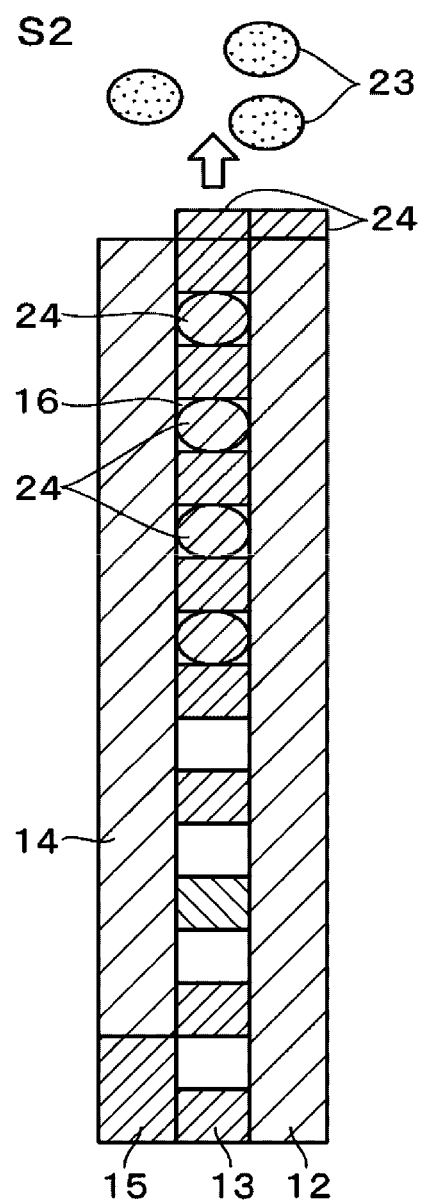

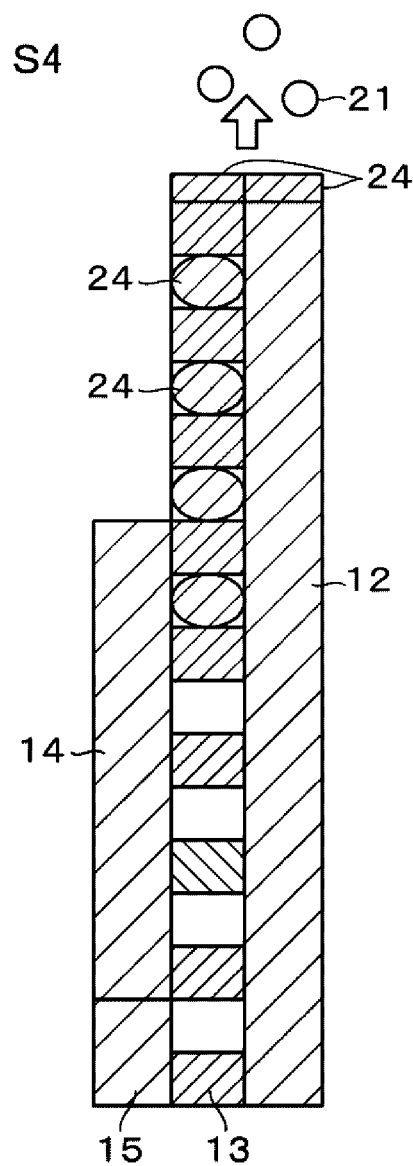

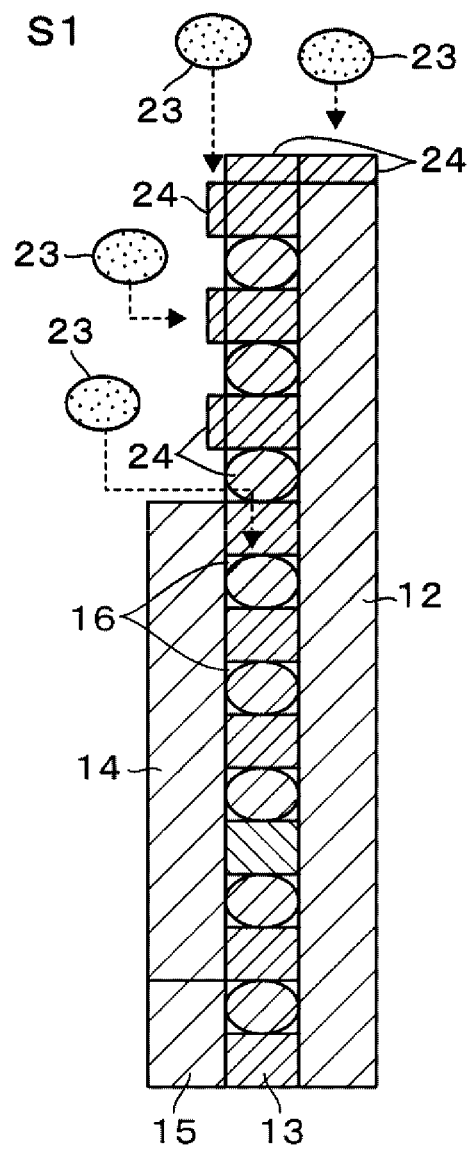

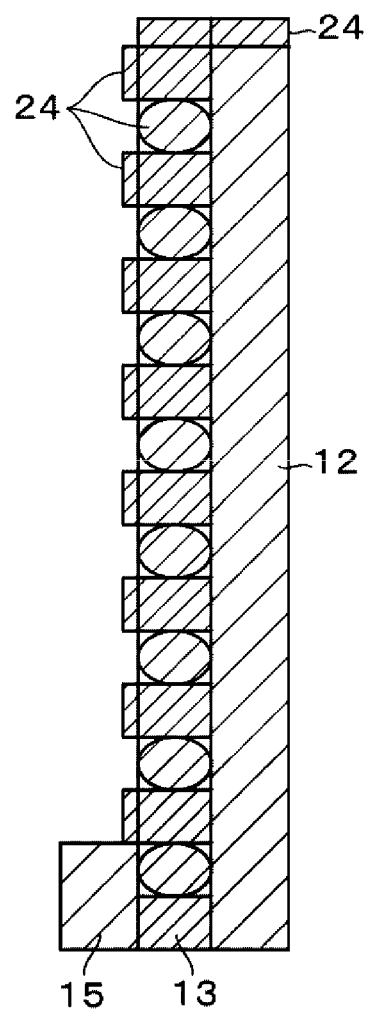

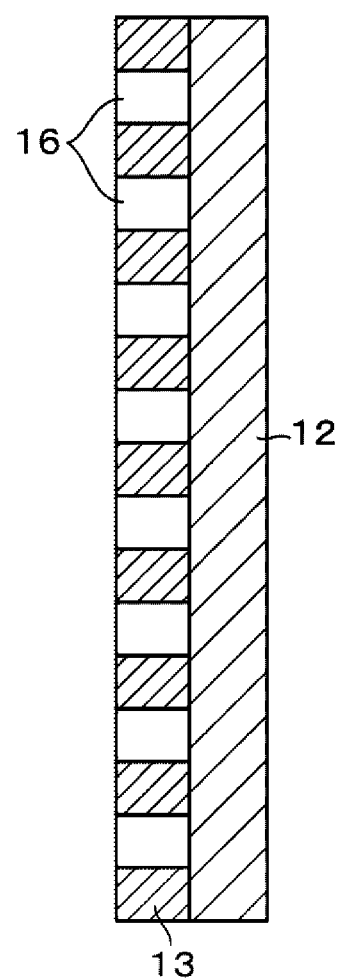

ETCHING METHOD AND ETCHING DEVICE

TECHNICAL FIELD

The present disclosure relates to an etching method and an etching apparatus.

BACKGROUND

In constituting a semiconductor device, etching is performed on various films formed on a semiconductor wafer (hereinafter, referred to as a "wafer") which is a substrate. For example, Patent Document 1 describes that a wafer on which an interlayer insulating film called a low-k film is formed is etched to form a recess for embedding a wiring line in the interlayer insulating film.

PRIOR ART DOCUMENT

Patent Document

Patent Document 1: Japanese Laid-Open Publication No. 2016-63141

The present disclosure provides a technique capable of switchably performing protection against an etching gas and etching with respect to an oxygen-containing silicon film formed on a substrate.

SUMMARY

An etching method of the present disclosure is an etching method of supplying etching gases to a substrate to etch a surface of the substrate, including a protection step of supplying amine gas to the substrate having an oxygen-containing silicon film to form a protective film for preventing etching by the etching gases on a surface of the oxygen-containing silicon film, in order to protect the oxygen-containing silicon film, and a first etching step of supplying a first etching gas, which is one of the etching gases and is a fluorine-containing gas, and the amine gas to the substrate to etch the oxygen-containing silicon film.

The present disclosure is capable of switchably performing, with respect to an oxygen-containing silicon film formed on a substrate, protection against an etching gas and etching.

BRIEF DESCRIPTION OF DRAWINGS

FIG. 2C is a process diagram illustrating the etching.
FIG. 3B is a process diagram illustrating the etching.
FIG. 4A is a process diagram illustrating the etching.
FIG. 5A is a process diagram illustrating the etching.
FIG. 6B is a process diagram illustrating the etching.

DETAILED DESCRIPTION

Figure 1:
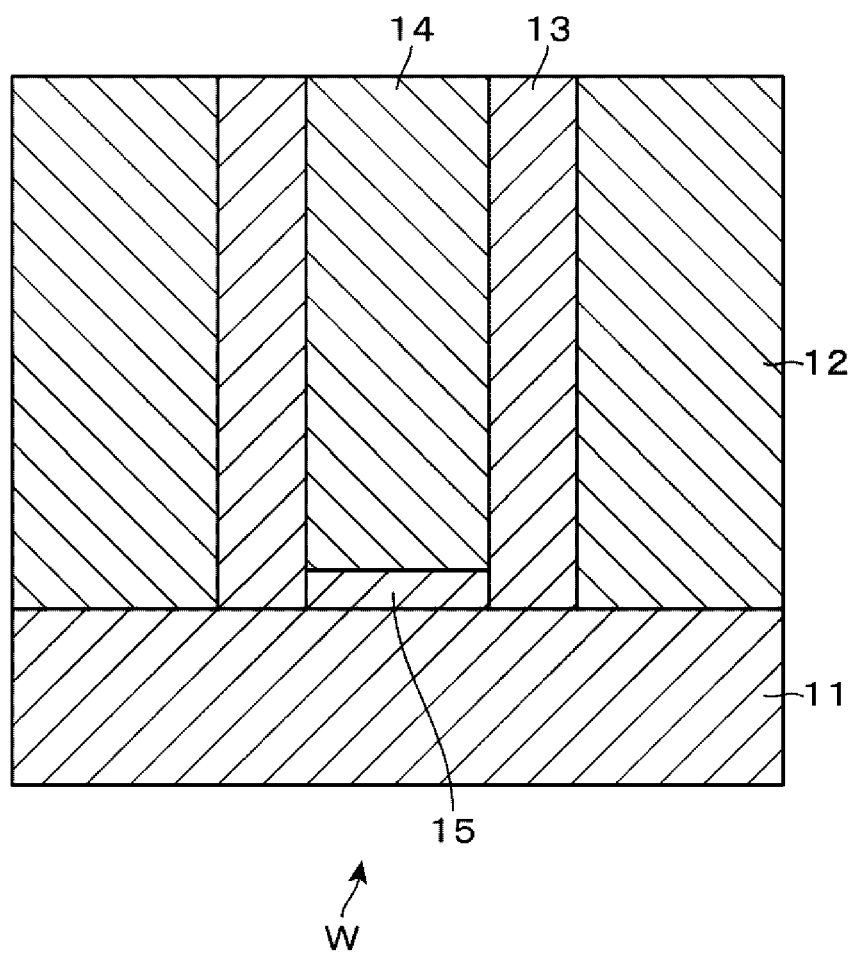
FIG. 1 is a vertical cross-sectional side view of a surface of a wafer on which etching and formation of a protective film according to an embodiment of the present disclosure are performed.

A process according to an embodiment of an etching method of the present disclosure will be described below. FIG. 1 illustrates a vertical cross-sectional side view of a surface portion of a wafer W on which the process is performed. A silicon oxide ($SiO_x$) film 12, a SiOCN film 13, a polysilicon film 14, and a silicon oxide film 15 are each formed on an underlayer film 11 provided on the wafer W. A recess is defined by the underlayer film 11 and the silicon oxide film 12, and a laminated film including the silicon oxide film 15 and the polysilicon film 14 is embedded in the recess. This laminated film is constituted such that the silicon oxide film 15 is covered with the polysilicon film 14. That is, the silicon oxide film 12 is disposed on the lower side, and the polysilicon film 14 is disposed on the upper side.

Then, between the side wall of the laminated film and the side wall of the recess, the SiOCN film 13 (that is, a film composed of silicon, oxygen, nitrogen, and carbon) is provided to surround the side of the laminated film and to be in contact with each of the sidewalls of the laminated film and the side wall of the recess. Therefore, the SiOCN film 13 is interposed between the laminated film (the silicon oxide film 15 and the polysilicon film 14) and the silicon oxide film 12. That is, each of the laminated film, the SiOCN film 13, and the silicon oxide film 12 is provided to be adjacent in that order in the lateral direction, and holes in the SiOCN film 13 are open to each of the laminated film and the silicon oxide film 12.

The polysilicon film 14, the SiOCN film 13, and the silicon oxide film 12 are exposed on the surface of the wafer W. The SiOCN film 13 is an interlayer insulating film called a low-k film, and is a porous film. The silicon oxide film 15 is a second silicon film containing oxygen, the silicon oxide film 12 is a first silicon film containing oxygen, and the SiOCN film is a third silicon film containing oxygen.

The outline of this embodiment will be described. In this embodiment, after a second etching step of etching the polysilicon film 14 to be etched is performed, a first etching step of etching the silicon oxide film 15 is performed. First, an etching gas 21 for the polysilicon film 14, which is, for example, $ClF_3$ gas, a mixed gas of fluorine ($F_2$) gas and ammonia ($NH_3$) gas, or iodine heptafluoride ($IF_7$) gas, is supplied to the wafer W. Each of the polysilicon film 14 and the silicon oxide films 12 and 15 is etchable by the etching gas 21, which is the second etching gas. The silicon oxide film 12 and the SiOCN film 13 are non-etching target films that are not desired to be etched.

In this embodiment, amine gas is supplied to the wafer W when performing the etching with the above-mentioned etching gas 21. As shown in an evaluation experiment to be described later, the adsorptivity of an amine to the silicon oxide film 12 and the SiOCN film 13 is higher than the adsorptivity of an amine to the polysilicon film 14, and the amine is hardly adsorbed to the polysilicon film 14. By using this difference in adsorptivity, a protection step in which, by supplying the amine gas to the wafer W, a protective film made of an amine component contained in the amine gas is selectively formed on the silicon oxide film 12 and the SiOCN film 13 among the silicon oxide film 12, the SiOCN film 13, and the polysilicon film 14. In a state in which the protective film has been formed, the etching gas 21 is supplied to the wafer W to selectively etch the polysilicon film 14.

Then, amine is also adsorbed on the hole walls in the SiOCN film 13 to block the holes, and the passage of the etching gas 21 through the holes is prevented. Therefore, the protective film is also formed in the holes of the SiOCN film 13. As a result, it is possible to prevent the etching gas 21 from being supplied from the recess in the surface of the wafer W formed by etching the polysilicon film 14 to the side wall of the silicon oxide film 12 through the holes, and thus prevent the side wall from being etched.

When the silicon oxide film 15 is exposed by etching the polysilicon film 14 in a state in which the protective film has been formed as described above, the etching gas supplied to the wafer W is switched from the etching gas 21 to hydrogen fluoride (HF) gas 22, which is an etching gas for the silicon oxide film. Amine gas is also supplied to the wafer W during the etching of the silicon oxide film 15, but the amine gas reacts with the HF gas 22 to promote the etching of the silicon oxide film 15. As described above, in the present embodiment, the process performed on the silicon oxide film using amine gas is switched between protection and etching depending on whether or not the HF gas is supplied.

Subsequently, with reference to FIGS. 2A to 6B, processes performed on the wafer W will be described in more detail step by step. FIGS. 2A to 6 are schematic views illustrating how the surface portion of the wafer W described with reference to FIG. 1 changes as the processes proceed, and the process illustrated in each of these figures is performed in a state in which the wafer W is carried into a processing container and the interior of the processing container is evacuated to create a vacuum atmosphere of a predetermined pressure. In the figures, reference numeral 16 indicates holes formed in the SiOCN film 13. In the following description, amine supplied to the wafer W is illustrated as reference numeral 23, and in this embodiment, amine 23 is, for example, butylamine ($C_4H_{11}N$). As described above, amine 23 is supplied to the wafer W as a gas to be adsorbed on the surface of each of the SiOCN film 13 and the silicon oxide film 12, but is not limited to being a gas at the time of the adsorption, and may be a solid or a liquid. As described above, the adsorbed amine 23 forms a protective film, and the protective film is illustrated as reference numeral 24 in the figures. Therefore, in the figures, for convenience, amine adsorbed on the wafer W is referred to as the protective film 24 to be distinguished from amine 23 not adsorbed on the wafer W.

Figure 2A:
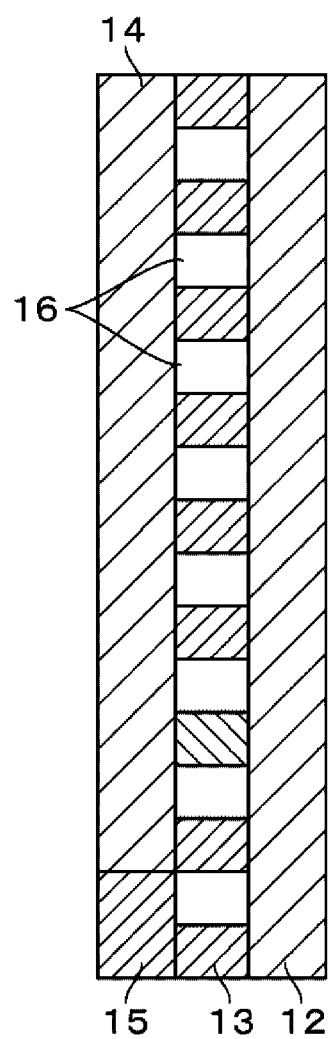
FIG. 2A is a process diagram illustrating the etching.
Figure 2B:
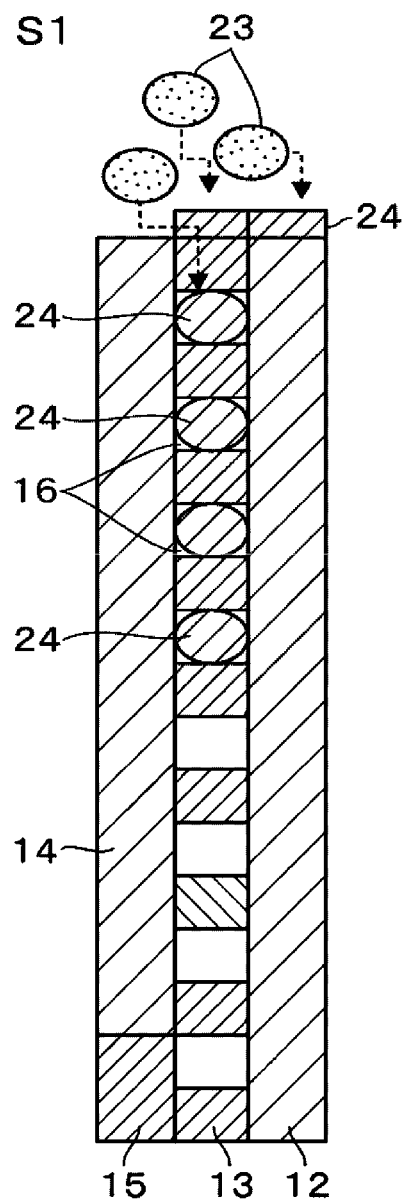
FIG. 2B is a process diagram illustrating the etching.

First, amine gas is supplied as amine 23 into the processing container (step S1, FIG. 2A, FIG. 2B). As described above, since amine 23 is easily adsorbed on the SiOCN film 13 and the silicon oxide film 12, adsorption on the surface (the top surface) of each of these films proceeds, and the protective film 24 is formed. Since the SiOCN film 13 has a higher adsorptivity for amine 23 than the silicon oxide film 12, the protective film 24 is formed thicker on the SiOCN film 13, but illustration of the difference in thickness is omitted in the figure. While the protective film 24 is formed in this way, amine 23 is adsorbed on the hole walls in the SiOCN film 13 and remains in the holes 16, so that the holes 16 are blocked. Therefore, as described above, the protective film 24 is also formed in the holes 16.

Subsequently, the supply of the amine gas into the processing container is stopped, and in the processing container, the exhaust and the supply of a purge gas, e.g., nitrogen gas ($N_2$), are performed (step S2, FIG. 2C). As a result, the amine gas that does not flow into the holes 16 and does not form the protective film 24 is entrained in and removed by the gas flow of the exhausted purge gas.

Figure 3A:
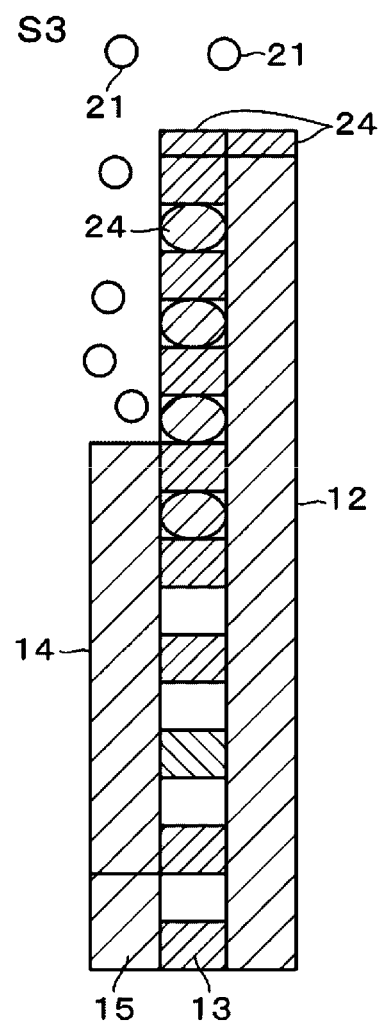
FIG. 3A is a process diagram illustrating the etching.

Subsequently, the etching gas 21 is supplied into the processing container, and the polysilicon film 14 not covered with the protective film 24 is etched, so a side wall on the upper side of the SiOCN film 13 is exposed (step S3, FIG. 3A). On the other hand, the formation of the protective film 24 prevents the SiOCN film 13 and the silicon oxide film 12 from being etched from its upper side. In addition, since the holes 16 on the upper side of the SiOCN film 13 are blocked by amine 23, it is also possible to prevent the etching gas 21 from being supplied to the side wall of the silicon oxide film 12 through the holes 16. That is, etching of the side wall is prevented. Thereafter, the supply of the etching gas 21 into the processing container is stopped, and the exhaust and the supply of the purge gas are performed in the processing container (step S4, FIG. 3B). Thus, the etching gas 21 remaining in the processing container is removed by the flow of the purge gas exhausted from the interior of the processing container.

Subsequently, amine gas is supplied into the processing container. That is, step S1 is performed again. In step S3 above, the polysilicon film 14 is etched to expose a side wall on the upper side of the SiOCN film 13. Therefore, amine 23 among the gases supplied in the secondly performed step S1 is supplied to holes 16 below the holes 16 to which the amine 23 was supplied in the first step S1 in the SiOCN film 13, and is adsorbed on the hole walls to block the holes 16 (FIG. 4A). In addition, the protective film 24 is also formed on the side wall of the exposed SiOCN film 13.

Thereafter, the exhaust and the supply of the purge gas into the processing container of step S2 are performed again. Subsequently, the supply of the etching gas 21 into the processing container in step S3 is performed, the polysilicon film 14 is further etched downward, and the exposed region on the side wall of the SiOCN film 13 expands downward. At this time as well, since the protective film 24 is formed as in the case of the first etching, the SiOCN film 13 and the silicon oxide film 12 are prevented from being etched from the upper side thereof.

Figure 4B:
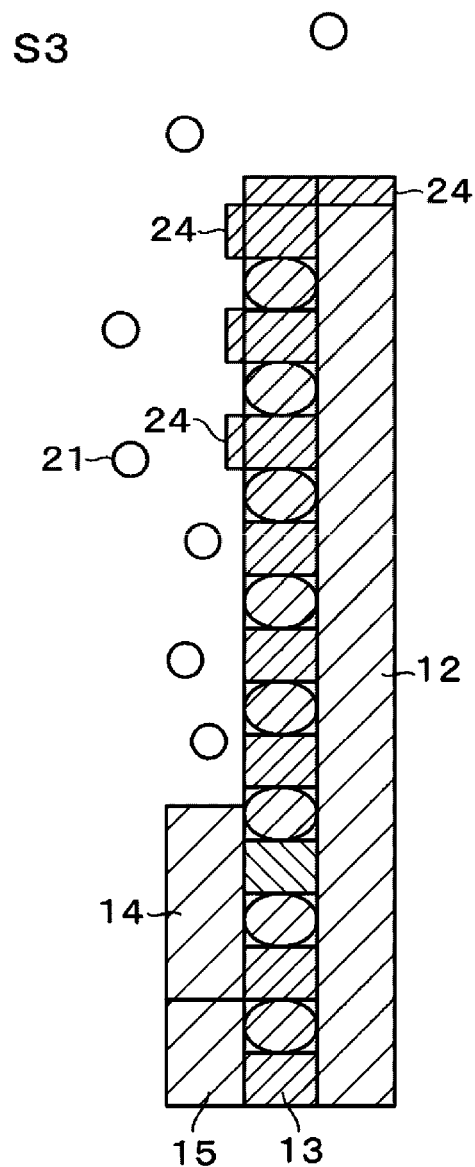
FIG. 4B is a process diagram illustrating the etching.

Since the region in which amine 23 is supplied to the SiOCN film 13 has been expanded downward by the secondly performed step S1, amine 23 remains as a protective film 24 in holes 16 near a side wall of the SiOCN film 13 that is newly-exposed by etching the polysilicon film 14. Therefore, in this secondly performed step S3 as well, the etching gas 21 is prevented from passing through the holes 16 in the SiOCN film 13 and from etching the silicon oxide film 12 (FIG. 4B). After the etching, the exhaust and the supply of the purge gas in step S4 are performed again.

Assuming that steps S1 to S4 that are sequentially performed in this manner constitute one cycle, the cycle is repeatedly performed a predetermined number of times even after, for example, the secondly performed step S4. By controlling this repetition, the etching of the polysilicon film 14 and the formation of the protective film 24 (protection of the silicon oxide film 12) are performed in combination, so that the polysilicon film 14 is etched downward while the etching of the silicon oxide film 12 is prevented. Then, for example, the polysilicon film 14 is entirely etched to expose the silicon oxide film 15 on the surface of the wafer W (FIG. 5A).

Figure 5B:
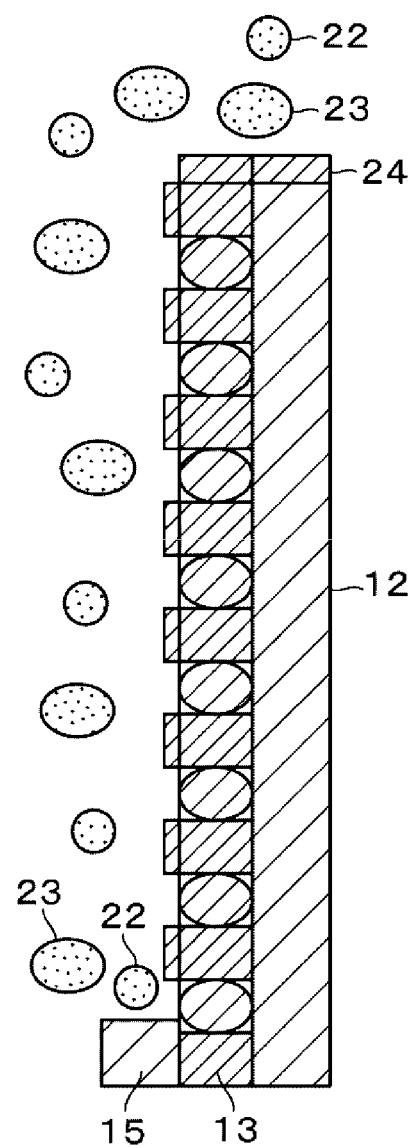
FIG. 5B is a process diagram illustrating the etching.

Thereafter, amine gas and HF gas 22 are supplied to the wafer W so that the silicon oxide film 15 is etched (FIG. 5B, step S5). The silicon oxide film 12 and the SiOCN film 13 are etchable by the HF gas 22 like the silicon oxide film 15, but are prevented from being etched by the protective film 24 already formed on the top surfaces of the silicon oxide film 12 and the SiOCN film 13. In addition, passage of the HF gas 22 through the holes 16 is also prevented by the protective film 24 already formed in the holes 16. That is, the etching of the side wall of the silicon oxide film 15 is prevented.

Figure 6A:
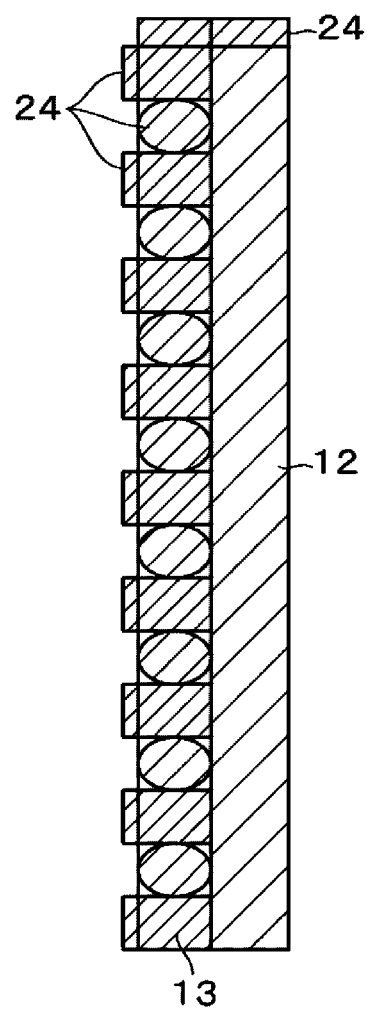
FIG. 6A is a process diagram illustrating the etching.

When the amine gas and HF gas 22 are supplied for a predetermined period of time and the underlayer film 11 below the silicon oxide film 15 is exposed, the supply of these gases is stopped (FIG. 6A). Thereafter, the wafer W is heated (step S6). Due to the heating, the amine 23 that entered the holes 16 to form the protective film 24 is vaporized and removed from the wafer W (FIG. 6B).

Figure 7:
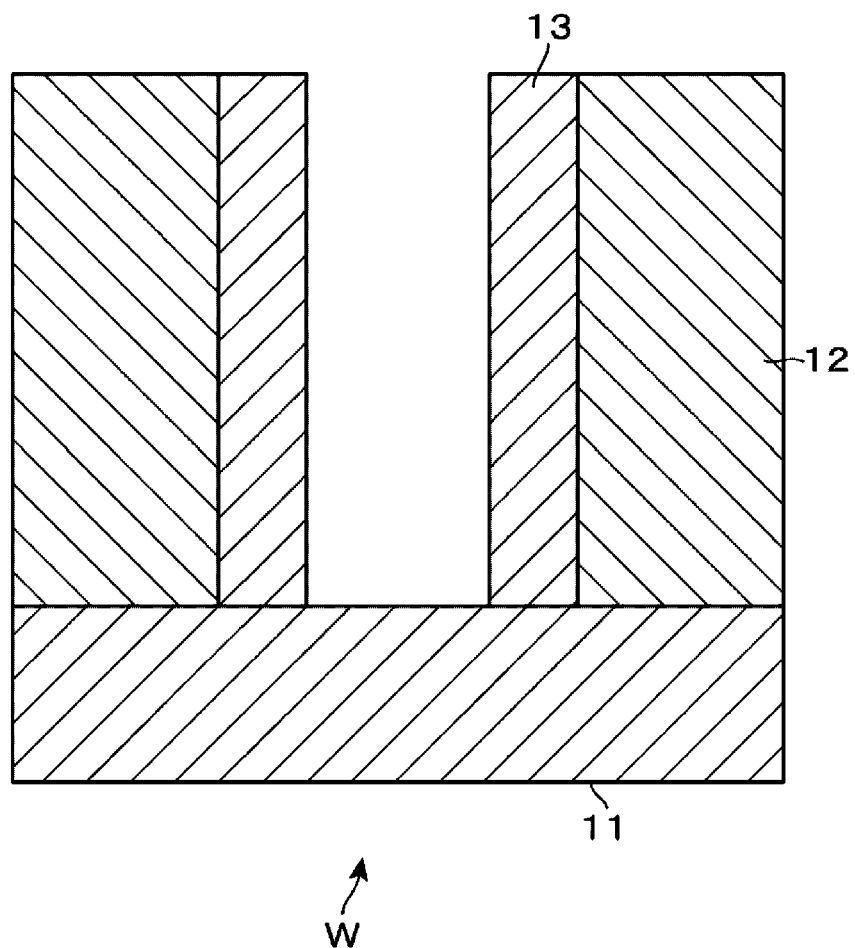
FIG. 7 is a vertical cross-sectional side view of the surface of the wafer W after the etching has been performed.

Although it has been described that amine 23 remains on the surface of the wafer W during the etching in the above-described series of processes, it is also conceivable that amine 23 remains as a reaction product on the surface of the wafer W, which is generated from the reaction with the etching gas 21 and HF gas 22. Further, amine 23 remaining as such a reaction product does not cause a problem. Then, when the reaction product is generated, in step S6, heating is performed to remove the reaction product. That is, the heating in step S6 is heating for removing amine 23 and/or the reaction product, and specifically, the wafer W is heated to, for example, 100 degrees C. to 400 degrees C. FIG. 7 illustrates the surface portion of the wafer W after step S6 is performed.

According to the processes of the above-described embodiment, when etching the polysilicon film 14, amine gas is supplied to form the protective film 24 on the silicon oxide film 12 and the SiOCN film 13, and etching by the etching gas 21 is performed while protecting the silicon oxide film 12 and the SiOCN film 13. Following the etching of the polysilicon film 14, amine gas and HF gas 22 are supplied to etch the silicon oxide film 15. By switching the action of the amine gas to the oxygen-containing silicon film depending on whether or not HF gas 22 is supplied, it is possible to etch the silicon oxide film 15 while preventing the silicon oxide film 12 and the SiOCN film 13 from being etched. Since the protective film 24 is also formed in the holes 16 in the SiOCN film 13 in addition to the top surfaces of the silicon oxide film 12 and the SiOCN film 13, the etching gas 21 is also prevented from etching the side wall of the silicon oxide film 12 through the holes 16. That is, it is possible to prevent etching of the silicon oxide film 12 even if the silicon oxide film is adjacent to the film having such holes 16.

It is known to use, for example, HF gas and NH$_3$ gas in etching the silicon oxide film. In such a case, the HF gas is activated by the NH$_3$ gas. However, as described above, in the present embodiment, instead of using NH$_3$ gas, amine gas for forming the protective film 24 is used to increase the activity of HF gas and etch the silicon oxide film 15. That is, compared with a case where the etching gas 21 and amine gas are used to etch the polysilicon film 14 and HF gas and NH$_3$ gas are used to etch the silicon oxide film 15, the process of the present embodiment does not require the supply of NH$_3$ gas. Therefore, since it is not necessary to configure the apparatus to be provided with a NH$_3$ gas supply system, it is possible to reduce the manufacturing cost and operating cost of the apparatus.

According to the present embodiment, it is possible to shorten the time from the termination of etching of the polysilicon film 14 to the initiation of etching of the silicon oxide film 15. More specifically, since amine gas is used for each of the etching of the polysilicon film 14 (steps S1 to S4) and the etching of the silicon oxide film 15 (step S5), it is easy to configure the apparatus such that steps S1 to S4 and step S5 are performed in the same processing container. That is, it is easy to configure the apparatus such that the wafer W transport time between processing containers is eliminated. That is, as described above, it is possible to etch the silicon oxide film 15 using HF gas and NH$_3$ gas, but using the amine gas instead of the NH$_3$ gas makes it easy to perform the processes within the same processing container. Since performing the processes in the same processing container eliminates unnecessary transportation, it is possible to increase throughput according to the present embodiment.

The exhaust flow rate of the processing container may be constant in the above-described steps S1 to S4, and the exhaust flow rates in steps S2 and S4 for removing an unnecessary gas in the processing container may be larger than the exhaust flow rates in steps S1 and S3 so that the gas can be removed more reliably. In steps S2 and S4, the unnecessary gas may be removed only by exhaust without supplying a purge gas.

Figure 8:
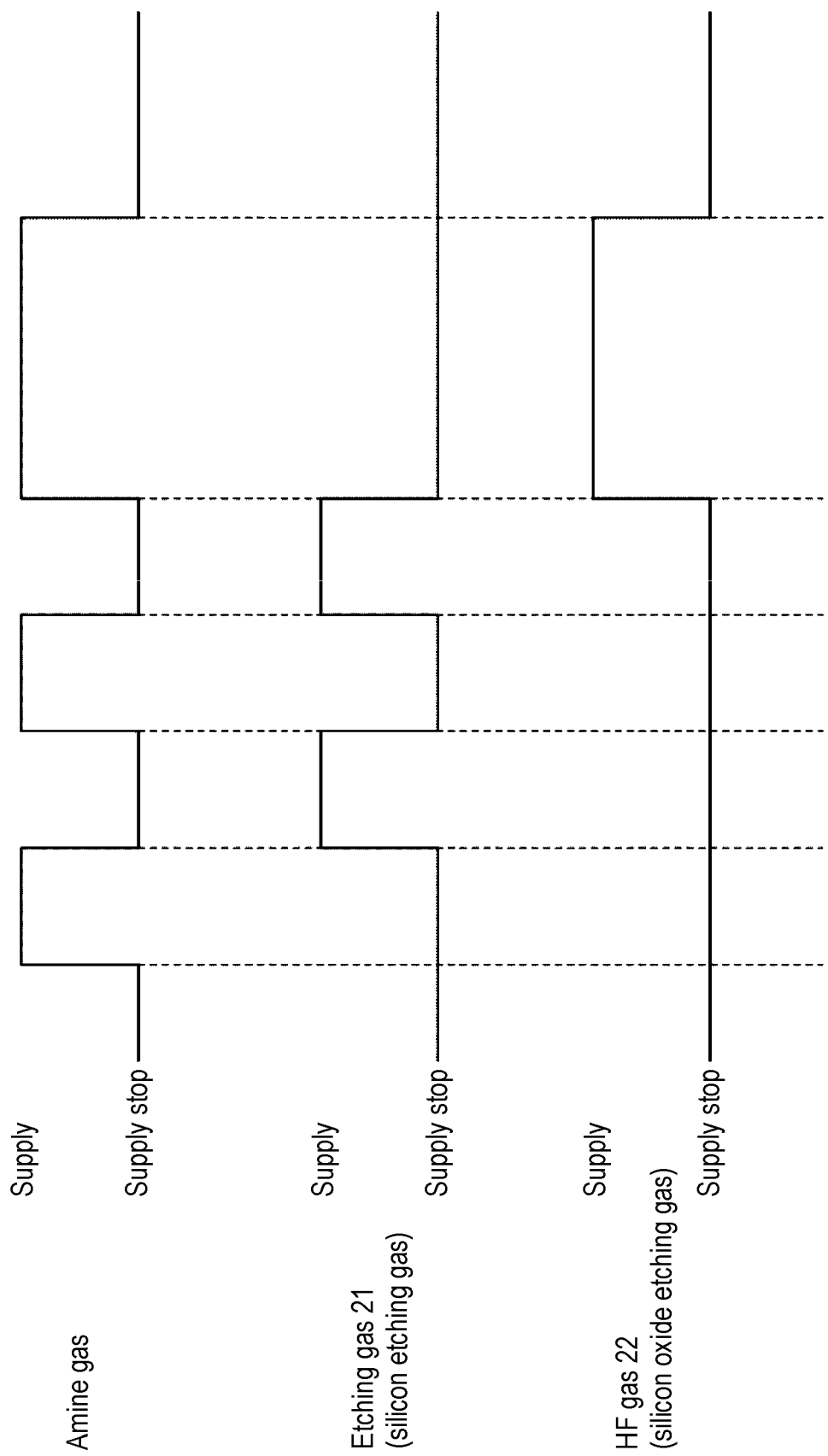
FIG. 8 is a chart illustrating an example of supply timing of each gas.

In etching the polysilicon film 14, steps S1 to S4 are illustrated to be repeated three or more times, but the number of repetitions is not limited to the above example, and may be, for example, two times. In addition, steps S1 to S4 may be performed only once without repeating. The above-described steps S2 and S4 for removing the unnecessary gas may be omitted. Specifically, as shown in FIG. 8 illustrating each of the timings of supplying the amine gas, the etching gas 21 for etching silicon, and the HF gas 22 into the processing container, from the termination of supply of one of amine gas and the etching gas 21, the other gas may be supplied without an interval. Even when steps S2 and S4 are omitted as described above, steps S1 and S3 for supplying the amine gas and the etching gas 21, respectively, are not limited to being repeated, and may be performed only once.

Figure 9:
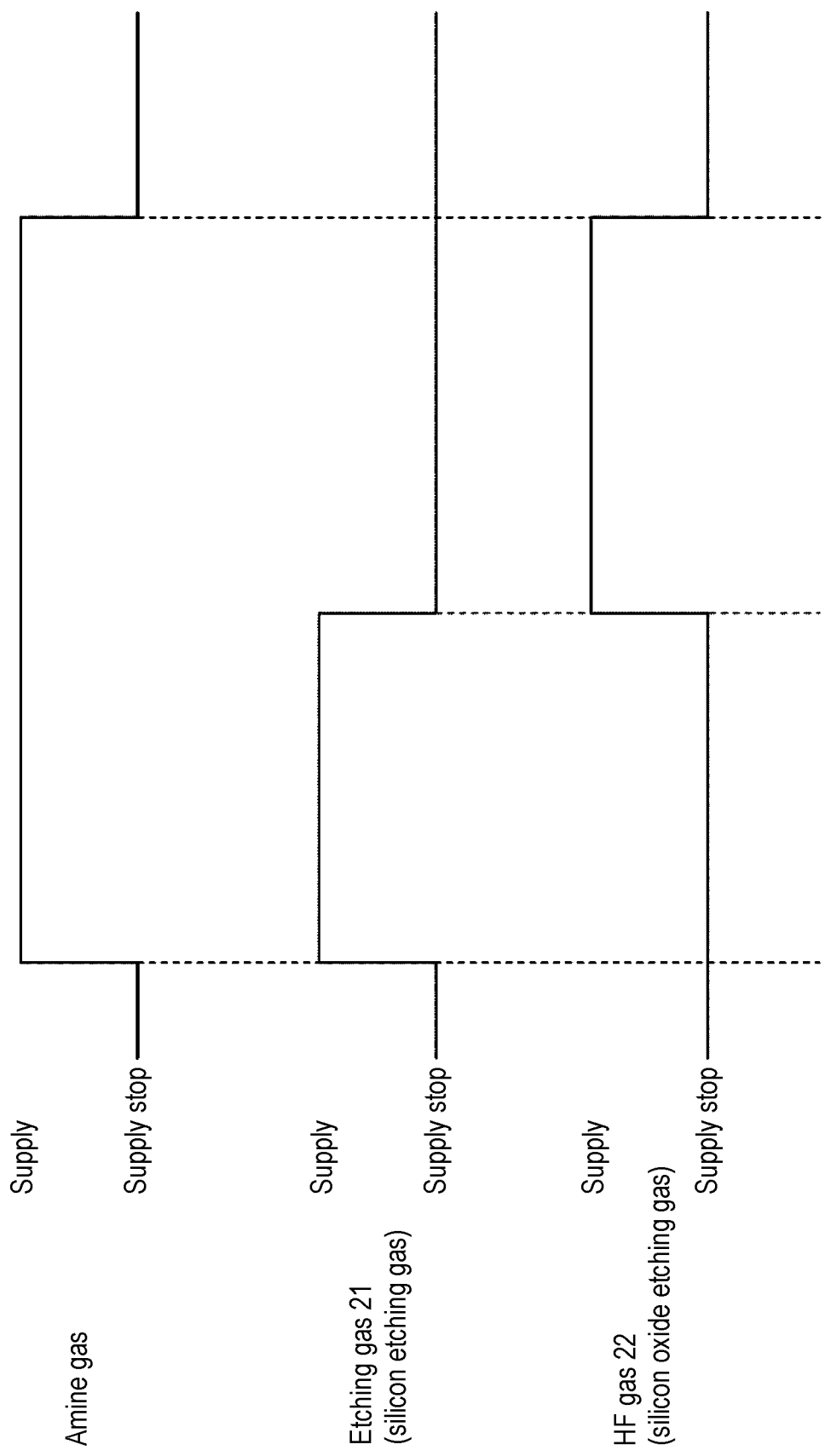
FIG. 9 is a chart illustrating an example of supply timing of each gas.

Furthermore, the amine gas and the etching gas 21 are not limited to being supplied sequentially. That is, the amine gas and the etching gas 21 are not limited to initiating, after the termination of supply of one gas, the supply of the other gas, and as illustrated in FIG. 9, the amine gas and the etching gas 21 may be simultaneously supplied to the wafer W to perform processes. When the amine gas and the etching gas 21 are simultaneously supplied in this way, the formation of the protective film 24 and the etching of the polysilicon film 14 are performed in parallel.

Figure 10:
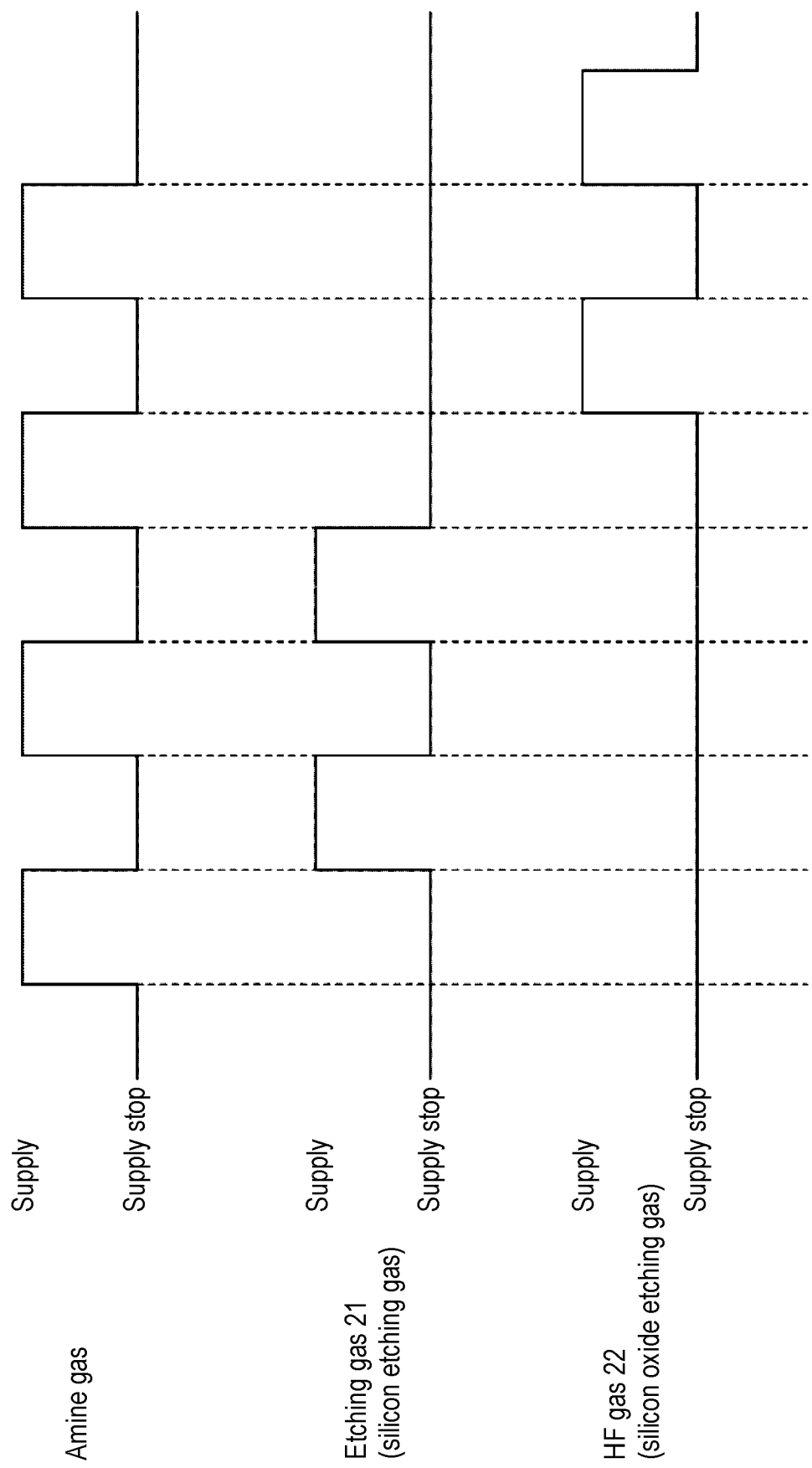
FIG. 10 is a chart illustrating an example of supply timing of each gas.

In etching the silicon oxide film 15, the amine gas and the HF gas 22 are illustrated to be supplied simultaneously in FIGS. 8 and 9 and the above-described FIGS. 2A to 6B, but are not limited to being supplied simultaneously in such a manner. For example, as illustrated in FIG. 10, the amine gas and the HF gas 22 may be alternately supplied in order. In supplying the amine gas and the HF gas 22 alternately in such a manner, the amine gas and the HF gas 22 may be supplied with an interval therebetween, and a purge gas may be supplied during the period between the supply of the amine gas and the supply of the HF gas. FIG. 10 illustrates a case where the amine gas and the etching gas 21 are alternately supplied when etching the polysilicon film 14 as in the example shown in FIG. 8, but the amine gas and the etching gas 21 are not limited to being alternately supplied in this manner.

The film structure of the wafer W illustrated in FIG. 1 is an example, and the silicon (Si) film to be etched is not limited to the polysilicon film 14, and may be, for example, an amorphous silicon (α-Si) film. The porous film is not limited to the SiOCN film 13, and a porous film such as a SiCO film or a SiCOH film may be formed instead of the SiOCN film 13. As shown in evaluation experiments, since amine is easily adsorbed on a silicon film containing oxygen (a film containing silicon and oxygen), it is preferable for the porous film to contain oxygen in order to adsorb amine thereon. "Containing oxygen" here does not mean containing oxygen as an impurity, but means containing oxygen as a component constituting the film. Although an example of using the HF gas 22 as the first etching gas for etching the silicon oxide film 15 has been illustrated, even when a fluorine-containing gas (a gas containing F as a constituent element) other than the HF gas 22 is used, the same effect as that of the HF gas may be expected. For example, carbon tetrafluoride ($CF_4$) gas, trifluoromethane ($CHF_3$) gas, or the like may be used.

In step S6 described above, the wafer W is heated such that the amine 23 and/or reaction products of the amine 23, the etching gas 21 and the HF gas 22 are removed from the silicon oxide film 12 and the SiOCN film 13. However, as long as there is no practical problem in the processes of subsequent steps or products, the amine 23 and/or the reaction products may be kept adsorbed on the surfaces of the silicon oxide film 12 and the SiOCN film 13 (including the surfaces of the holes), i.e., the amine 23 and/or the reaction products may remain as such. Therefore, the heating process in step S6 is not always essential.

In addition, amine 23 constituting the amine gas is not limited to butylamine. Specific examples include hexylamine, dipropylamine, n-octylamine, tertbutylamine, decylamine, dodecylamine, dicyclohexylamine, and tetradecylamine. The boiling point of each of these exemplified amines is in a range of 100 degrees C. to 400 degrees C. Therefore, in order to remove the amine in a vaporized state in step S6 of the above-described embodiment, it is preferable to heat the wafer W to 100 degrees C. to 400 degrees C., as described above.

Subsequently, a substrate processing apparatus 3 for performing a series of above-described processes will be described with reference to a plan view of FIG. 11. The substrate processing apparatus 3 includes a carry-in/out part 31 for carrying in/out a wafer W, two load-lock chambers 41 provided adjacent to the carry-in/out part 31, two heat treatment modules 40 provided adjacent to the two load lock chambers 41, respectively, and two etching modules 5 provided adjacent to the two heat treatment modules 40, respectively. The substrate processing apparatus 3 is configured to perform the processes of steps S1 to S5 in the same processing container.

The carry-in/out part 31 includes a normal pressure transport chamber 33 provided with a first substrate transport mechanism 32 and having a normal pressure atmosphere, and a carrier stage 35 provided at a side of the normal pressure transport chamber 33 and configured to place thereon carriers 34 for accommodating wafers W. In the figure, reference numeral 36 indicates an orienter chamber adjacent to the normal pressure transport chamber 33, wherein the orienter chamber is provided to rotate a wafer W to optically obtain the amount of eccentricity and to align the wafer W with respect to the first substrate transport mechanism 32. The first substrate transport mechanism 32 transports wafers W among the carriers 34 on the carrier stage 35, the orienter chamber 36, and the load-lock chambers 41.

In each load-lock chamber 41, for example, a second substrate transport mechanism 42 including an articulated arm structure is provided, and the second substrate transport mechanism 42 transports wafers W among the load-lock chamber 41, a heat treatment module 40, and an etching module 5. The interior of a processing container constituting each heat treatment module 40 and the interior of the processing container constituting each etching module 5 have a vacuum atmosphere, and the interior of each load-lock chamber 41 may be configured to be switched between a normal pressure atmosphere and a vacuum atmosphere such that wafers W can be delivered between the interiors of these processing containers having a vacuum atmosphere and the normal pressure transport chamber 33.

In the figure, reference numeral 43 indicates openable/closable gate valves, which are provided between the normal pressure transport chamber 33 and the load lock chambers 41, between the load lock chambers 41 and the heat treatment modules 40, and between the heat treatment modules 40 and the etching modules 5, respectively. Each heat treatment module 40 includes the above-mentioned processing container, an exhaust mechanism configured to evacuate the interior of the processing container to form a vacuum atmosphere, a stage provided in the processing container and configured to be capable of heating a wafer W placed thereon, and the like, and is configured to be capable of performing step S6 described above.

Subsequently, the etching module 5 will be described with reference to a vertical cross-sectional side view of FIG. 12. The etching module 5 performs the processes of steps S1 to S5 on a wafer W, and includes, for example, a circular processing container 51. That is, the processes of steps S1 to S5 are performed in the same processing container. The processing container 51 is an airtight vacuum container, and a circular placement table (stage) 61 having a horizontally formed surface (top surface) on which a wafer W is placed is provided at the lower side of the interior of the processing container 51. In the figure, reference numeral 62 indicates a stage heater embedded in the stage 61, wherein the stage heater heats the wafer W to a predetermined temperature so that the above-described steps S1 to S5 can be performed. In the figure, reference numeral 63 indicates a support column that supports the stage 61, which is a placement part, on the bottom surface of the processing container 51. In the figure, reference numeral 64 indicates vertical lifting pins, wherein the lifting pins protrude and retract from the surface of the stage 61 by a lifting mechanism 65 to deliver a wafer W between the above-mentioned second substrate transport mechanism 42 and the stage 61. Three lifting pins 64 are provided, but only two are illustrated.

In the figure, reference numeral 66 indicates a side wall heater provided in the side wall of the processing container 51, which regulates the temperature of the atmosphere inside the processing container 51. The side wall of the processing container 51 is provided with a wafer W transport port which can be opened and closed (not shown). In the figure, reference numeral 67 indicates an exhaust port opened in the bottom surface of the processing container 51, wherein the exhaust port is connected to an exhaust mechanism 68 including a vacuum pump, a valve, and the like via an exhaust pipe. By regulating the exhaust flow rate from the exhaust port 67 by the exhaust mechanism 68, the pressure in the processing container 51 is regulated.

Above the stage 61, a gas shower head 7 is provided in the ceiling of the processing container 51 to face the stage 61. The gas shower head 7 includes a shower plate 71, a gas diffusion space 72, and a diffusion plate 73. The shower plate 71 is horizontally provided to form the bottom surface portion of the gas shower head 7, and a large number of gas ejection holes 74 are dispersed in the shower plate 71 to eject gas to the stage 61 in a shower form. The gas diffusion space 72 is a flat space formed such that the lower side thereof is partitioned by the shower plate 71 in order to supply gas to each gas ejection hole 74. The diffusion plate 73 is horizontally provided to divide the gas diffusion space 72 into upper and lower portions. Reference numeral 75 in the figure indicates through holes formed in the diffuser plate 73, and a large number of through holes are dispersively perforated in the diffuser plate 73. In the figure, reference numeral 77 indicates a ceiling heater, which regulates the temperature of the gas shower head 7.

The downstream ends of the gas supply pipes 78 and 81 are connected to the upper side of the gas diffusion space 72. The upstream side of the gas supply pipe 78 is connected to a source 70 of the etching gas 21 via a flow rate regulator 79. The flow rate regulator 79 is configured with a valve or a mass flow controller and regulates the flow rate of the gas supplied to the downstream side of the gas supply pipe 78. Each flow rate regulator, which will be described later, has the same configuration as the flow rate regulator 79, and regulates the flow rate of the gas supplied to the downstream side of the pipe that is provided with the flow rate regulator. In addition, the downstream end of the gas supply pipe 52 is connected to the downstream side of the flow rate regulator 79 in the gas supply pipe 78, and the upstream side of the gas supply pipe 52 is connected to a HF gas 22 source 54 via a flow rate regulator 53. Therefore, the supply of the etching gas 21 and the supply of the HF gas 22 to the gas shower head 7 may be performed independently of each other.

The upstream side of the gas supply pipe 81 is connected to a tank 83 in which liquid amine is stored via a flow rate regulator 82. The tank 83 is equipped with a heater that heats and vaporizes the amine inside the tank 83, and is configured to be capable of supplying the vaporized amine (amine gas) to the downstream side of the gas supply pipe 81. For example, the gas supply pipe 81 branches on the upstream side of the flow rate regulator 82 to form a gas supply pipe 84. The gas supply pipe 84 is connected to a nitrogen ($N_2$) gas source 86 via a flow rate regulator 85. Therefore, the amine gas and the $N_2$ gas may be independently supplied to the gas shower head 7. A heater (not illustrated) is provided in the gas supply pipe 81 to prevent liquefaction of the circulating amine gas.

The corresponding relationship between the above-described steps S1 to S5 performed in the etching module 5 and the gases supplied from the gas shower head 7 will be described. In step S1, amine gas is supplied to the gas shower head 7 from the above-described tank 83 to be supplied into the processing container 51. In steps S2 and S4, $N_2$ gas is supplied to the gas shower head 7 from the $N_2$ gas source 86 to be supplied as a purge gas into the processing container 51. In step S3, the supply of gases from the tank 83 and the $N_2$ gas source 86 is stopped, and the etching gas 21 is supplied from the source 70 to the gas shower head 7 to be supplied into the processing container 51. In step S5, the supply of amine gas from the tank 83 to the gas shower head 7, and the supply of HF gas 22 from the supply source 54 to the gas shower head 7 are performed, and thus these gases are supplied into the processing container 51.

In performing respective processes of the above-described steps S1 to S5, the temperature of the wafer W in the etching module 5 is, for example, 60 degrees C. to 120 degrees C. Heating the wafer W to such a relatively high temperature prevents ammonium fluorosilicate (AFS), which is a by-product, from remaining on the wafer W when the silicon oxide film 15 is etched. In addition, the pressure in the processing container 51 is, for example, 1.33 Pa (10 mTorr) to 1,333 Pa (10 Torr), and the processes of steps S1 to S5 are performed.

Figure 11:
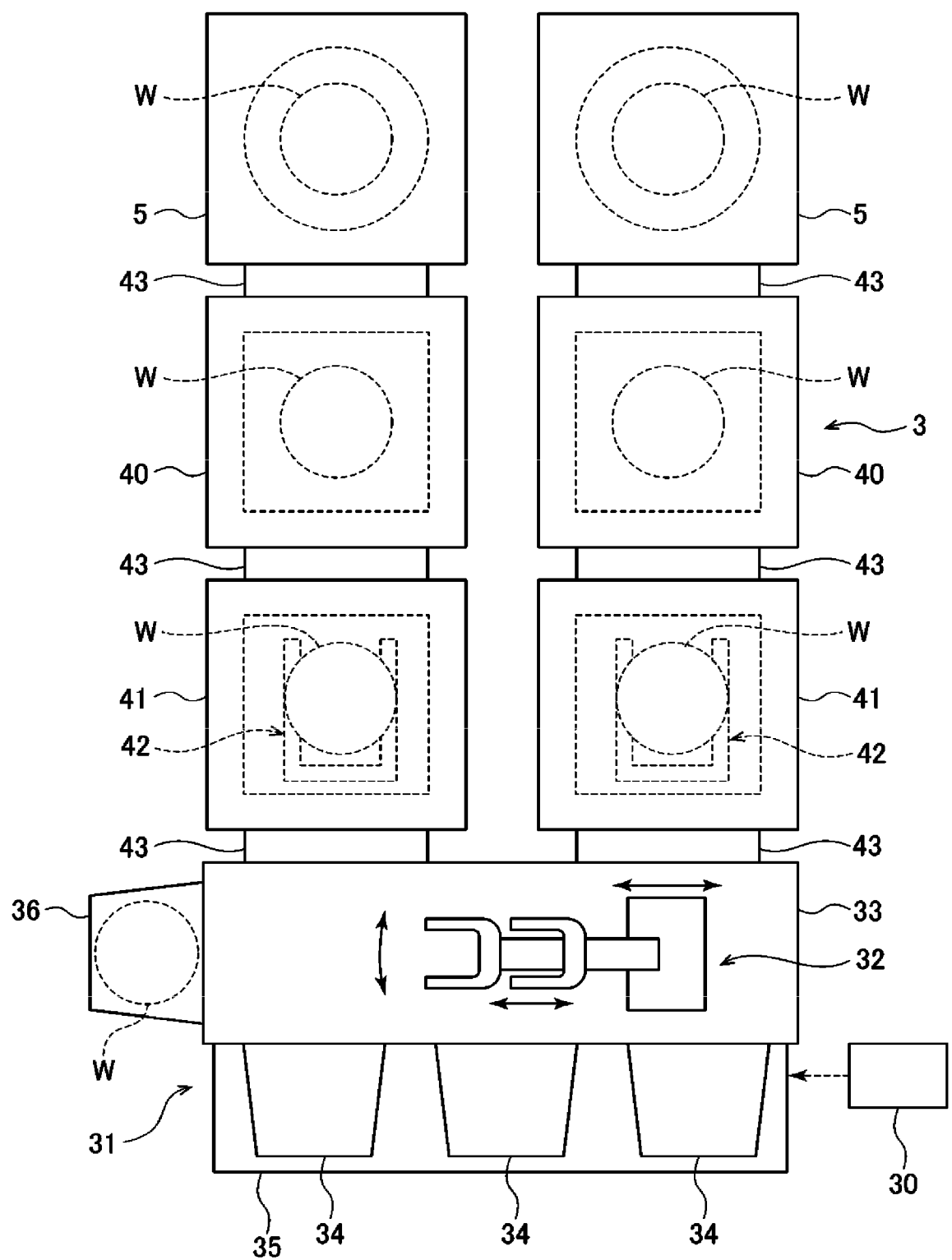
FIG. 11 is a schematic plan view of a substrate processing apparatus for performing etching.
Figure 12:
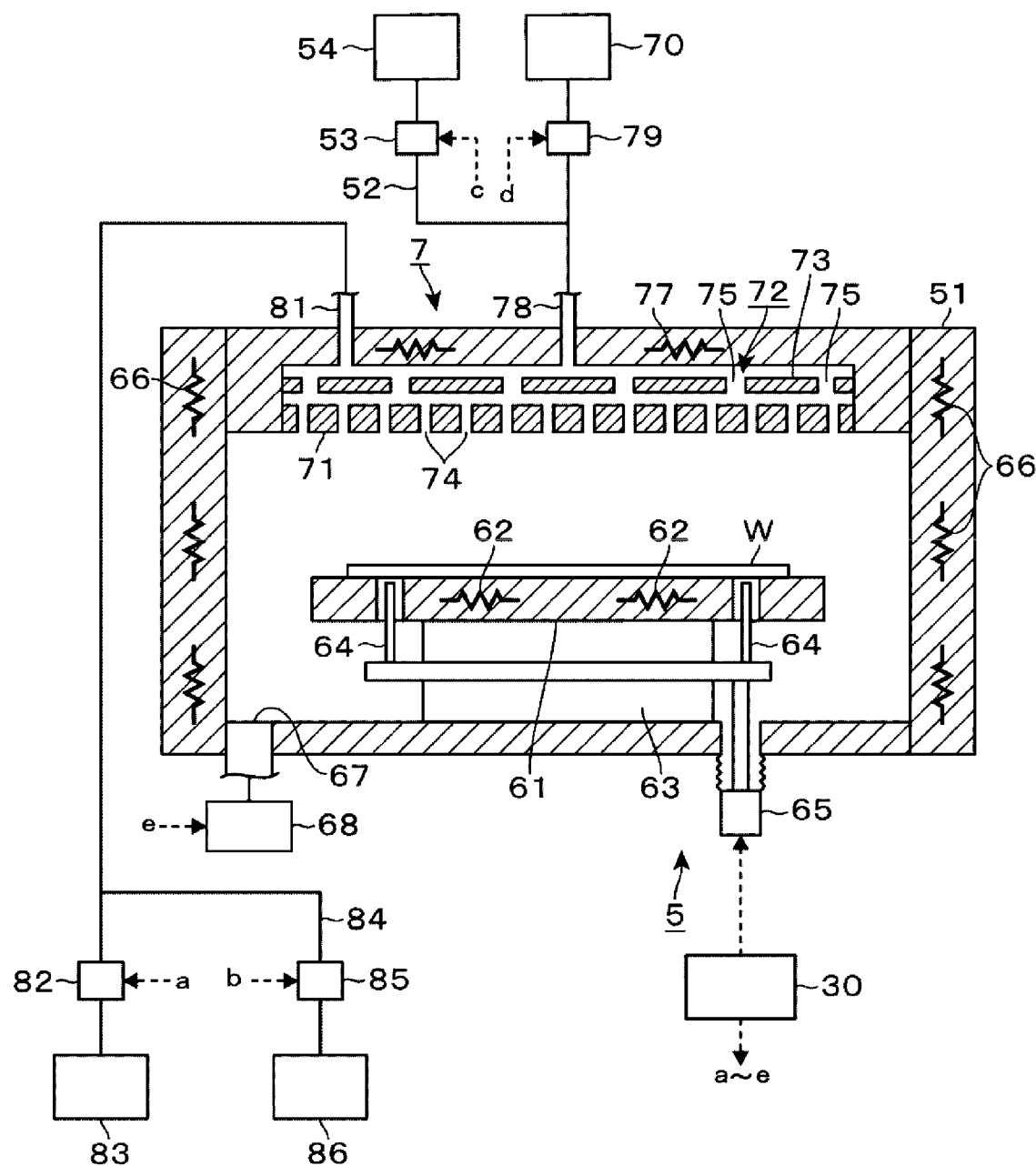
FIG. 12 is a vertical cross-sectional side view of an etching module provided in the substrate processing apparatus.

As illustrated in FIGS. 11 and 12, the substrate processing apparatus 3 includes a controller 30 which is a computer, and the controller 30 includes a program, a memory, and a CPU. The program incorporates instructions (each step) for processing a wafer W and transporting the wafer W as described above, and the program is stored in a computer storage media such as a compact disk, a hard disk, a magneto-optical disk, a DVD, or the like and installed in the controller 30. The controller 30 outputs control signals to each part of the substrate processing apparatus 3 according to the program to control the operation of each part. Specifically, the operation of the etching module 5, the operation of the heat treatment module 40, the operation of the first substrate transport mechanism 32, the operation of the second substrate transport mechanism 42, and the operation of the orienter chamber 36 are controlled by control signals. The operations of the etching module 5 include respective operations such as regulating the output of each heater, supplying/stopping each gas from the gas shower head 7, regulating the exhaust flow rate by the exhaust mechanism 68, and raising and lowering the lifting pins 64 by the lifting mechanism 65. An etching apparatus is configured by such controller 30 and the etching module 5.

A transport path of a wafer W in the substrate processing apparatus 3 will be described. As described with reference to FIG. 1, the carrier 34 containing a wafer W on which each film is formed is placed on the carrier stage 35. Then, the wafer W is transported in the order of the normal pressure transport chamber 33→the orienter chamber 36→the normal pressure transport chamber 33→the load-lock chamber 41, and transported to the etching module 5 via the heat treatment module 40. Then, as described above, the processes described as steps S1 to S5 are performed, and the polysilicon film 14 and the silicon oxide film 15 are etched. Subsequently, the wafer W is transported to a heat treatment module 40 and subjected to the process of step S6. Thereafter, the wafer W is transported in the order of the load-lock chamber 41 and the normal pressure transport chamber 33 and returned to the carrier 34.

In the substrate processing apparatus 3, as described above, since the etching of the polysilicon film 14 (steps S1 to S4) and the etching of the silicon oxide film 15 (step S5) are performed in the same processing chamber 51, it is possible to obtain a high throughput. However, these etching processes may be performed in separate processing containers, respectively. The supply of the amine gas and the supply of the etching gas 21 in steps S1 to S4 are also not limited to being performed within the same processing container 51. That is, these processes by gas supply may also be performed in separate processing containers, but it is preferable to perform the processes in the same processing container because the time required for transporting a wafer W can be eliminated.

Figure 13:
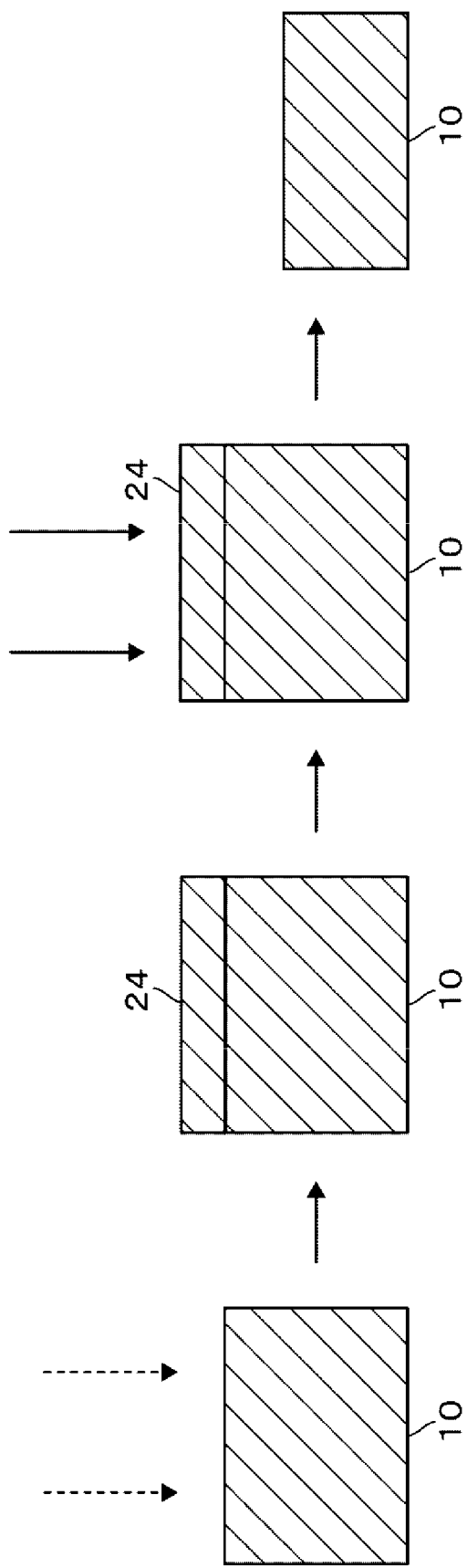
FIG. 13 is an explanatory view illustrating another embodiment of etching and formation of a protective film.

FIG. 13 illustrates a silicon oxide film 10 formed on the surface of a wafer W. A protective film 24 is formed by supplying amine gas (indicated by dotted lines in FIG. 13) to the silicon oxide film 10. Then, HF gas 22 (indicated by solid lines in FIG. 13) is supplied at a desired timing. For example, an etching gas is supplied to the wafer W in a state in which the protective film 24 has been formed as described above, and a film (not illustrated) formed on the surface of the wafer W other than the silicon oxide film 10 is etched. Thereafter, the HF gas 22 is supplied to the wafer W to remove the protective film 24 by the HF gas 22, and to remove the surface of the silicon oxide film 10. Therefore, in the process examples described with reference to FIGS. 2A to 6B, the positions of the silicon oxide film on which the protective film 24 is formed and the silicon oxide film to be etched were different, but even for the same silicon oxide film, it is also possible to perform both protection from the etching gas by forming a protective film and etching.

On the other hand, it may be possible that after partially etching the silicon oxide film 10 by supplying the HF gas 22 first, a protective film 24 is formed by supplying the amine gas so that the silicon oxide film 10 can be protected from the etching gas supplied to the wafer W after the protective film 24 is formed (the etching gas for etching a film formed on the surface of the wafer W other than the silicon oxide film 10). Therefore, either the formation of the protective film 24 or the etching of the silicon oxide film may be performed first. The etching of the silicon oxide film and the formation of the protective film 24 may each be performed multiple times. As described above, the present technology is advantageous in that it is easy to control protection of the silicon oxide film and etching by switching the gas supplied to the wafer W. The silicon oxide films 10, 12, and 15 described above may be formed by heating Si in an oxygen atmosphere, and may be formed by CVD or ALD.

The example in which the formation of the protective film and the etching are performed on the silicon oxide film as a representative silicon film containing oxygen has been illustrated, but the silicon film containing oxygen is not limited to the silicon oxide film. For example, the formation of the protective film 24 and the etching may be performed on the above-described SiOCN film.

It should be noted that the embodiments disclosed herein are exemplary in all respects and are not restrictive. The above-described embodiments may be omitted, replaced, modified, and/or combined in various forms without departing from the scope and spirit of the appended claims.

EVALUATION EXPERIMENTS

Evaluation experiments conducted in connection with the technology of the present disclosure will be described.

Evaluation Experiment 1

As Evaluation Experiment 1, the adsorption energies of $NH_3$, butylamine, hexylamine, and trimethylamine, which are molecules containing N (nitrogen), for various molecules containing Si were measured by simulation. Specifically, the adsorption energies for silicon (Si), silicon carbide (SiC), silicon nitride (SiN), $SiO_2CN$ (=SiOCN), and silicon oxide (SiO) were measured.

Figure 14:
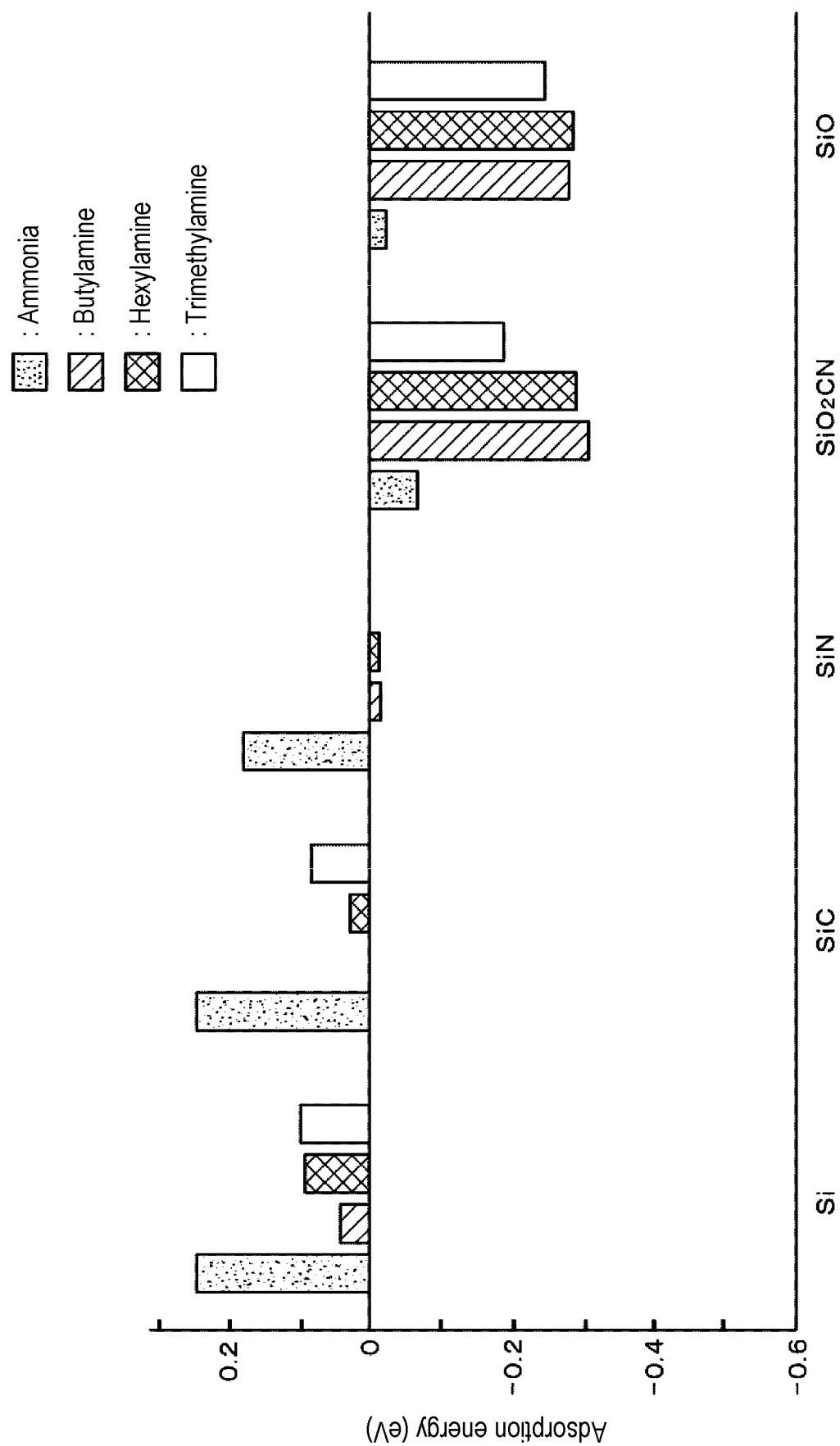
FIG. 14 is a graph showing results of an evaluation experiment.

FIG. 14 is a bar graph showing results of Evaluation Experiment 1. The vertical axis of the graph represents an adsorption energy (unit: eV). The lower the adsorption energy, the easier the adsorption. As shown in FIG. 14, respective amines have different adsorption energies for Si, SiC, SiN, $SiO_2CN$, and SiO, respectively. For SiN, $SiO_2CN$, and SiO among these compounds, amines have negative adsorption energies and are adsorbable to these compounds. In particular, for $SiO_2CN$ and SiO, adsorption energies are low, and each amine is easily adsorbed. This is because the adsorption sites of amines are O atoms. On the other hand, for Si and SiC, the adsorption energy of each amine is positive and the adsorptivity of each amine is low.

From the results of this Evaluation Experiment 1, it can be seen that the adsorptivities of various amines differ for each type of silicon-containing film. Therefore, it is presumed that protecting one of these silicon-containing films while etching another film is possible using such a difference in the adsorptivities of amines as described in the embodiment. In addition, the graph of FIG. 14 shows that the difference in adsorption energy between Si, SiOCN, and SiO is particularly large. Therefore, as described above with reference to FIGS. 2A to 6B, it can be seen that it is possible to selectively etch the polysilicon film 14 by forming the protective film 24 on the silicon oxide film 12 and the SiOCN film 13. In addition, it can be seen that since the adsorption energy of amines for SiOCN is low, it is possible to sufficiently seal the holes 16 of the SiOCN film 13 described above.

Evaluation Experiment 2

In Evaluation Experiment 2, butylamine gas was supplied to substrates having different types of silicon-containing films on the surfaces thereof. Specifically, the gas was supplied to the substrates on which a SiGe film, an α-Si film, a SiOC film, a SiN film, a polysilicon (Poly-Si) film, a silicon oxide ($SiO_2$) film, and a SiOCN film are formed as the silicon-containing films, respectively. Then, the adsorption amount of butylamine on each film was measured by using a gas chromatograph-mass spectrometer (GC-MS).

Figure 15:
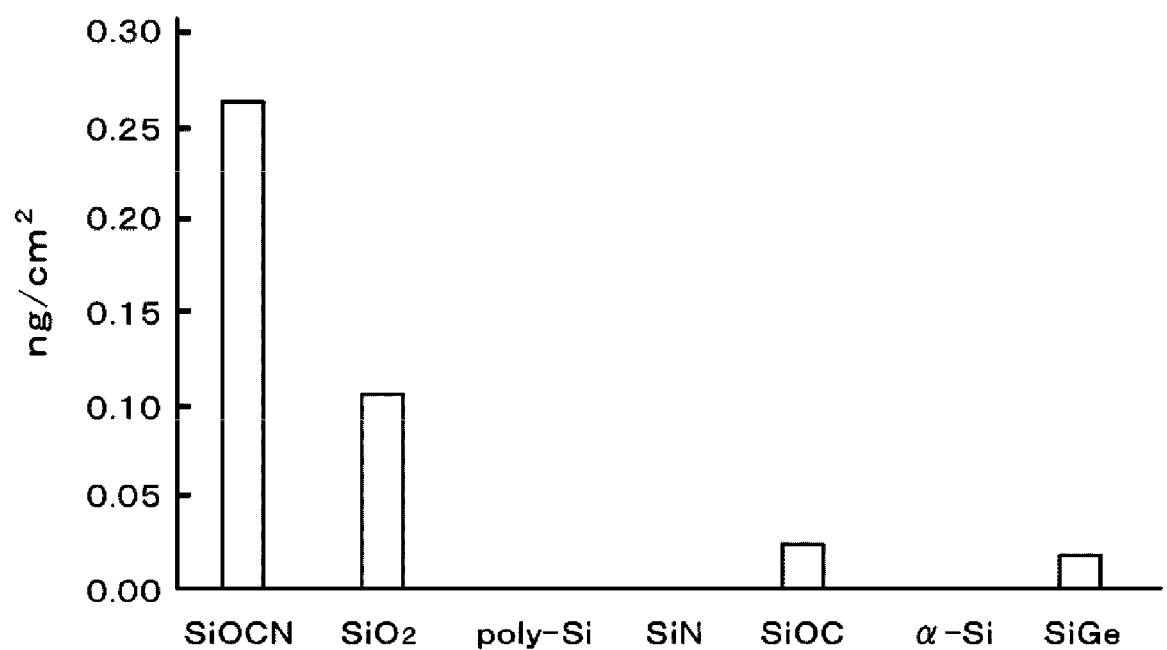
FIG. 15 is a graph showing results of an evaluation experiment.

FIG. 15 is a graph showing results of this Evaluation Experiment 2. As shown in FIG. 15, the adsorption amounts of butylamine on respective silicon-containing films were different from each other. The adsorption amounts on the polysilicon film, the α-Si film, and the SiN film are approximately 0 $ng/cm^2$. The adsorption amounts on the SiOC film and the SiGe film are approximately 0.02 $ng/cm^2$ to 0.03 $ng/cm^2$, the adsorption amount on the silicon oxide film is approximately 0.10 $ng/cm^2$, and the adsorption amount on the SiOCN film is approximately 0.27 $ng/cm^2$.

As described above, it can be seen from the results of Evaluation Experiment 2 that, since the adsorption amounts of amines differ for respective types of films, selective etching can be performed based on the differences in the adsorption amounts, like Evaluation Experiment 1. Specifically, it can be seen that, since the adsorption amounts are polysilicon film<silicon oxide film<SiOCN film, it is possible to selectively etch the polysilicon film 14 by forming the protective film 24 on the silicon oxide film 12 and the SiOCN film 13, as described with reference to FIGS. 2A to 6B. It can also be seen that the holes 16 in the SiOCN film 13 can be sufficiently sealed.

EXPLANATION OF REFERENCE NUMERALS

W: wafer, 12: silicon oxide film, 22: HF gas, 23: amine, 24: protective film

What is claimed is:

1. An etching method of supplying etching gases to a substrate to etch a surface of the substrate, the etching method comprising:

a protection step of supplying amine gas to the substrate having an oxygen-containing silicon film to form a protective film for preventing etching by the etching gases on a surface of the oxygen-containing silicon film, for protecting the oxygen-containing silicon film; and a first etching step of supplying a first etching gas, which is one of the etching gases and is a fluorine-containing gas, and the amine gas to the substrate to etch the oxygen-containing silicon film.

2. The etching method of claim 1, wherein the first etching step is performed after the protection step.

3. The etching method of claim 2, further comprising:

a second etching step of supplying a second etching gas, which is one of the etching gases, to etch a film to be etched, which is provided on the substrate, wherein the protection step is performed before the second etching step, and the protective film prevents etching by the second etching gas.

4. The etching method of claim 3, wherein the oxygen-containing silicon film includes a first oxygen-containing silicon film and a second oxygen-containing silicon film, wherein the protection step includes a step of forming the protective film on a surface of the first oxygen-containing silicon film, and wherein the first etching step includes a step of etching the second oxygen-containing silicon film.

5. The etching method of claim 4, wherein a film including a hole, which opens to each of the film to be etched and the first oxygen-containing silicon film, is interposed between the film to be etched and the first oxygen-containing silicon film in the substrate, wherein the protection step includes a step of forming the protective film in the hole to block the hole, and wherein the second etching step includes a step of supplying the second etching gas in a state the hole has been blocked with the protective film.

6. The etching method of claim 5, wherein the film blocking the hole is a third oxygen-containing silicon film.

7. The etching method of claim 5, wherein the film including the hole is a porous film.

8. The etching method of claim 3, wherein the second etching step includes a step of etching the film to be etched which covers a second oxygen-containing silicon film by supplying the second etching gas to the film to be etched.

9. The etching method of claim 3, wherein the film to be etched is a silicon film.

10. The etching method of claim 1, wherein the oxygen-containing silicon film is a silicon oxide film.

11. The etching method of claim 1, wherein the first etching gas is hydrogen fluoride gas.

* * * * *